United States Patent
Kuroda

[11] Patent Number: 5,936,436
[45] Date of Patent: Aug. 10, 1999

[54] SUBSTRATE POTENTIAL DETECTING CIRCUIT

[75] Inventor: Tadahiro Kuroda, Yokohama, Japan

[73] Assignee: Kabushiki Kaisha Toshiba, Tokyo, Japan

[21] Appl. No.: 08/787,711

[22] Filed: Jan. 24, 1997

[30] Foreign Application Priority Data

Jan. 26, 1996 [JP] Japan .................................. 8-011529

[51] Int. Cl.[6] .................................................. H03K 5/153
[52] U.S. Cl. ................................................ 327/81; 327/80
[58] Field of Search ............................... 327/77, 80, 81, 327/534, 535, 536, 537, 544

[56] References Cited

U.S. PATENT DOCUMENTS

| | | | |
|---|---|---|---|
| 4,874,967 | 10/1989 | Deane | 327/537 |
| 5,034,625 | 7/1991 | Min et al. | 327/536 |
| 5,113,088 | 5/1992 | Yamamoto et al. | 327/536 |
| 5,302,861 | 4/1994 | Jelinek | 327/77 |

FOREIGN PATENT DOCUMENTS

| | | |
|---|---|---|
| 388918 | 9/1990 | European Pat. Off. . |
| 573009 | 12/1993 | European Pat. Off. . |
| 58-021856 | 2/1983 | Japan . |
| 61-196617 | 8/1986 | Japan . |

*Primary Examiner*—Toan Tran
*Attorney, Agent, or Firm*—Loeb & Loeb LLP

[57] ABSTRACT

The disclosed substrate potential detecting circuit can reduce both the power consumption and the pattern area thereof. The substrate potential detecting circuit comprises: a series circuit composed of a plurality of same-conductivity type MOS transistors. Each transistor has a source terminal connected to a substrate terminal thereof and a drain terminal connected to a gate terminal thereof. Further, the channel widths of all the MOS transistors are determined equal to each other and so selected that all the transistors can be operative in a sub-threshold region, respectively.

9 Claims, 5 Drawing Sheets

SUBSTRATE POTENTIAL DETECTING CIRCUIT

BACKGROUND OF THE INVENTION

1. Field of the Invention

The present invention relates to a substrate potential detecting circuit.

2. Description of the Prior Art

In general, a substrate potential detecting circuit is used as when a substrate potential generating circuit is controlled to be turned on or off according to the substrate potential. As shown in FIG. 9, a prior art substrate potential detecting circuit is a series circuit constructed by connecting n-units of resistances $R_1, R_2, \ldots, R_n$ in series. One end of this series circuit is connected to a drive supply voltage V1; the other end thereof is connected to a substrate voltage V2; and an output voltage $V_{out}$ is derived from an intermediate junction node of the series circuit.

In the prior art substrate potential detecting circuit as described above, it is desirable to use high resistances to reduce the power consumption thereof. For instance, when the substrate potential detecting circuit is connected between a supply potential of 5V and a p-type substrate potential of 0 V and further when current consumed through the resistances is required to be reduced down to 0.01 $\mu$A, the necessary resistance value is as high as 500M$\Omega$. For this purpose, in general, a well having a high sheet resistance has been so far used. In this case, however, there exists a problem in that a large pattern area is required. For instance, when the sheet resistance of the well is 1 k$\Omega$, a layout pattern having a width of 1 $\mu$m and a length of 40 mm is necessary, so that a pattern area of about 1 mm square is needed. On the other hand, since there exists such a tendency that the sheet resistance value of the well decreases with increasing microminiaturization of the device, this problem becomes serious more and more.

Further, when a signal varying very slowly (e.g., the substrate potential) is inputted to the substrate potential detecting circuit as an input signal, since the output is responsive to a slight potential variation (e.g., caused by noise) of the substrate potential, a resistance against noise is also required.

SUMMARY OF THE INVENTION

With these problems in mind, therefore, it is the object of the present invention to provide a substrate potential detecting circuit which can be formed in a small area, while reducing the power consumption.

To achieve the above-mentioned object, the first aspect of the present invention provides a substrate potential detecting circuit, comprising: a series circuit composed of a plurality of same-conductivity type MOS transistors each having a source terminal connected to a substrate terminal thereof and a drain terminal connected to a gate terminal thereof, channel widths of all the MOS transistors being determined equal to each other and so selected that all the transistors are operative in a sub-threshold region, respectively.

Further, the second aspect of the present invention provides a substrate potential detecting circuit, comprising: first to n-th (n$\geq$2) series circuits each composed of a plurality of same-conductivity type MOS transistors; each of the transistors for constituting the i-th (i=1, ..., n) series circuit having a source terminal connected to a substrate terminal thereof and a drain terminal connected to a gate terminal thereof; the i-th (i=2, ..., n) series circuit being connected between two different junction nodes of a transistor train for constituting the (i-1)-th series circuit; and channel widths of all the MOS transistors for constituting the i-th (i=1, ..., n) series circuit being determined equal to each other and so selected that all the transistors for constituting the i-th series circuit are operative in a sub-threshold region, respectively.

Further, the third aspect of the present invention provides the substrate potential detecting circuit of the first aspect, which further comprises: an inversion gate; and an RS flip-flop circuit having: a set input terminal connected to one of two different junction nodes of a transistor train for constituting the series circuit, and a rest terminal connected to the other of the two different junction nodes via the inversion gage.

Further, the fourth aspect of the present invention provides the substrate potential detecting circuit of the second aspect, which further comprises: an inversion gate; an RS flip-flop circuit having: a set input terminal connected to one of two different junction nodes of a transistor train for constituting the n-th series circuit, and a rest terminal connected to the other of the two different junction nodes via the inversion gage.

DETAILED DESCRIPTION OF THE PREFERRED EMBODIMENTS

Figure 1:
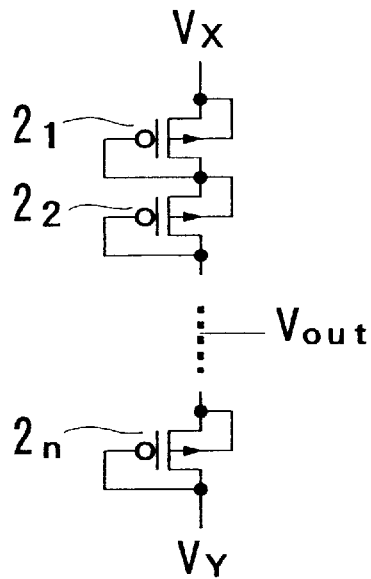
FIG. 1 is a circuit diagram showing a first embodiment of the substrate potential detecting circuit according to the present invention.

FIG. 1 shows the first embodiment of the substrate potential detecting circuit according to the present invention, which is a series circuit composed of a plurality of p-type MOS transistors $2_1, \ldots, 2_n$ each having a source terminal connected to each substrate terminal and a drain terminal connected to a gate thereof. In other words, the drain terminal of a transistor $2_i$ (i=1, 2, ..., n-1) is connected a source terminal of another transistor $2_{i+1}$, respectively. Further, a potential $V_X$ is applied to the source terminal of the transistor $2_1$; another potential $V_Y (<V_X)$ is applied to the drain terminal of the transistor $2_n$; and an output signal $V_{out}$ is derived from an intermediate junction node of the above-mentioned series circuit. Further, one of the potentials $V_X$ and $V_Y$ is a potential of the drive voltage supply and the other thereof is a potential of the substrate to be detected (i.e., an input signal).

Further, the channel widths of all the transistors $2_1, \ldots, 2_n$, are determined equal to each other. In this case, it is necessary to select the channel width thereof in such a way that the transistor is operative in the sub-threshold region of the transistor.

The operation of the above-mentioned series circuit in which the channel widths of all the transistors $2_1, \ldots, 2_n$ are selected in such a way that each transistor is operative in the sub-threshold region thereof will be explained hereinbelow.

The drain current $I_{DS}$ of a MOS transistor in the sub-threshold region can be expressed as $$I_{DS} = \frac{I_0}{W_0} \cdot W \cdot 10^{(V_{GS}-V_{TC})/S} \quad (1)$$

where W denotes the channel width of the MOS transistor; $V_{GS}$ denotes the gate-source voltage; $V_{TC}$ denotes a gate-source voltage obtained when a constant drain current begins to flow in the transistor having a channel width $W_0$. Further, S denotes a S factor as expressed below:

$$S = \frac{kT}{q} \cdot \left(1 + \frac{C_{DP}}{C_{OX}}\right) \cdot \ln 10 \quad (2)$$

where k denotes the Boltzmann's constant; T denotes the absolute temperature; q denotes the elementary electric charge; $C_{OX}$ denotes a capacity of the gate oxide film; and $C_{DP}$ denotes a capacity of a depletion layer under the gate.

As described above, when the MOS transistors $2_i$ (i=, 2, ..., n) each having a source terminal connected to the substrate terminal and a drain terminal connected to the gate thereof are connected in series by n-stages by connecting the drain terminal of the MOS transistor $2_i$ to the source terminal of the adjacent MOS transistor $2_{i+1}$ sequentially as shown in FIG. 1, since the current flowing through each of the transistors is equal to each other, as far as the channel width of each of the transistor is equal to each other, the following expression can be obtained $$10^{(V_1-V_2-V_\pi)/S} = \ldots = 10^{(V_n-V_{n+1}-V_\pi)/S} \quad (3)$$

where $V_i$ and $V_{i+1}$ (i=1, ..., n) denote the source and drain potentials of the series connected MOS transistors $2_i$, respectively.

Therefore, the following expression can be obtained on the basis of the above expression (3):

$$V_1-V_2=V_2-V_3=\ldots=V_n-V_{n+1} \quad (4)$$

Therefore, it is possible to generate a potential difference obtained by dividing the voltage ($|V_1-V_{n+1}|=|V_X-V_Y|$) applied between both ends of the series connected transistor circuit by the number (n) of the transistors between the source terminal and the drain terminal of each transistor. In other words, the value obtained by dividing the voltage ($|V_X-V_Y|$) across the series connected transistor circuit by the number (n) of the transistors for constituting the transistor circuit becomes equal to or lower than the threshold voltage of the transistor $2_i$. As a result, when the series connected transistor circuit as described above is used, it is possible to form a substrate potential detecting circuit of small current consumption in a small pattern area.

Figure 2:
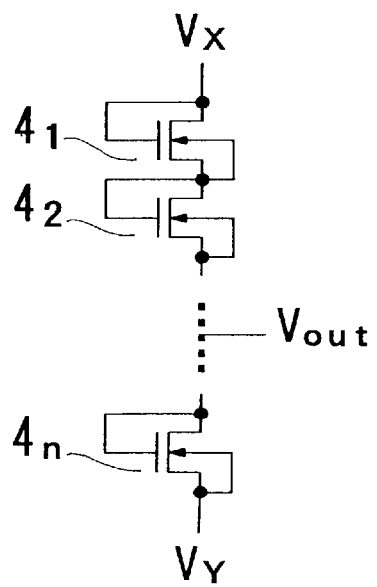
FIG. 2 is a circuit diagram showing a second embodiment of the substrate potential detecting circuit according to the present invention.

FIG. 2 shows the second embodiment of the substrate potential detecting circuit according to the present invention. In this second embodiment, the p-type MOS transistors $2_i$ shown in FIG. 1 are all replaced with series connected n-type MOS transistors $4_1, \ldots, 4_n$. In each of the transistors $4_i$ (i=1, 2, ..., n), the source terminal thereof is connected to the substrate terminal thereof, and the drain terminal thereof is connected to the gate terminal thereof, respectively. Further, a potential $V_X$ is applied to the drain terminal of the transistor $4_1$; another potential $V_Y (<V_X)$ is applied to the source terminal of the transistor $4_n$; and an output signal $V_{out}$ is derived from an intermediate junction node of the above-mentioned series connected transistor circuit.

Further, the channel widths of all the transistors $4_1, \ldots, 4_n$ are determined equal to each other, and the channel width thereof is so selected that the transistor is operative in the sub-threshold region of the transistor.

The second embodiment of the substrate potential detecting circuit as shown in FIG. 2 is of course provided with the same effect as with the case of the first embodiment shown in FIG. 1.

Figures 3A, 3B:
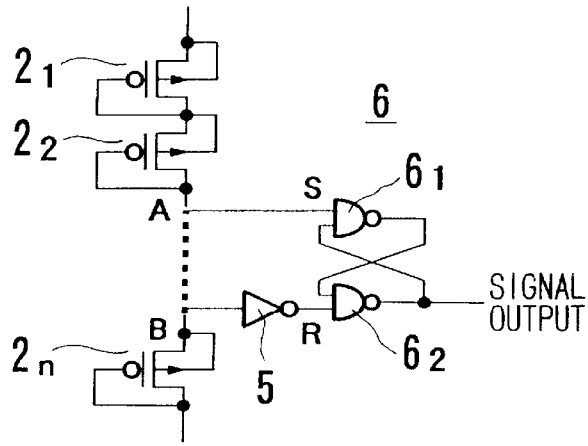
FIG. 3A is a circuit diagram showing a third embodiment of the substrate potential detecting circuit according to the present invention.
FIG. 3B is an illustration for assistance in explaining the operation of the third embodiment of the circuit shown in FIG. 3A.

FIGS. 3A and 3B show the third embodiment of the substrate potential detecting circuit, in which FIG. 3A shows the circuit construction and FIG. 3B is used to explain the operation thereof. This third embodiment is different from the first embodiment in that an RS flip-flop circuit composed of an inversion gate 5 and two cross-connected two-input NAND gates $6_1$ and $6_2$ is additionally connected.

A set terminal S of the RS flip-flop 6 is connected to an intermediate junction node A having a higher potential between the two intermediate junction nodes A and B of the series circuit composed of n-units of series connected p-type MOS transistors $2_1, \ldots, 2_n$, and a reset terminal R thereof is connected to another intermediate junction node B having a lower potential between the two nodes A and B via an inversion gate 5.

In this third embodiment, the output signal of the substrate potential detecting circuit is derived from a Q output terminal of the RS flip-flop circuit 6. Further, in the same way as with the case of the first embodiment, the channel widths of all the transistors $2_1, \ldots, 2_n$ are determined equal to each other, and the channel width thereof is so selected that the transistor is operative in the sub-threshold region of the transistor. Therefore, the value obtained by dividing the voltage applied across both the terminals of the series connected transistor circuit by the number n of the transistors for constituting the series circuit is equal to or smaller than the threshold voltage value of the transistors $2_i$ (i=1, ..., n).

The operation of the third embodiment will be explained hereinbelow with reference to FIG. 3B. In the case where a supply voltage $V_{DD}$ (drive supply voltage) is applied to the source of the transistor $2_1$, the drain of the transistor $2_n$ is connected to the p-type substrate, and the potential of this p-type substrate is an input signal. In this case, when the input signal is at an H level, this implies that the potential of the p-type substrate is higher than a predetermined value (<0). On the other hand, when the input signal is at an L level, this implies that the potential of the p-type substrate is lower than the predetermined value.

Further, in the case where a ground voltage is applied to the drain of the transistor $2_n$, the source of the transistor $2_1$ is connected to the n-type substrate, and the potential of this n-type substrate is an input signal. In this case, when the input signal is at an H level, this implies that the potential of the n-type substrate is higher than a predetermined value (>$V_{DD}$). On the other hand, when the input signal is at an L level, this implies that the potential of the n-type substrate is lower than the predetermined value.

When the input signal is at the H level, since the set input S of the RS flop-flop circuit 6 is at H and since the rest input R thereof is at L, the output of the RS flip-flop circuit 6 is at H, as listed in FIG. 3B. Here, when the input signal changes from H to L, since the level at the junction node B changes from H to L and thereby since the reset input R of the RS flip-flop circuit 6 changes to H, the two inputs of the RS flip-flop circuit 6 are both at H, and the output of the RS flip-flop circuit is kept at H, as listed by FIG. 3B. Further, when the input signal level decreases and thereby the potential level at the junction point node A changes from H to L, since the set input S of the RS flip-flop circuit 6 is at L and the reset input R thereof at H, the output changes to L, as listed by FIG. 3B.

In contrast with this, when the input signal changes from L to H, since the potential level at the junction node A changes from L to H and thereby since the set input S of the RS flip-flop circuit 6 changes to H, the two inputs of the RS flip-flop circuit 6 are both at H, and the output of the RS flip-flop circuit is kept at L. Further, when the input signal level increases and thereby the potential at the junction point node B changes also from L to H, since the set input S of the RS flip-flop circuit 6 is at H and the reset input R thereof at L, the output changes to H, as listed by FIG. 3B.

Therefore, in this third embodiment, the change in potential level of the signal input to L can be detected by the potential at the junction node A, and the change in potential level of the signal input to H can be detected by the potential at the junction node B. In other words, in this embodiment of the substrate potential detecting circuit, since the RS flip-flop circuit 6 is provided with Schmitt gate characteristics having a hysteresis width which corresponds to the potential difference between the two junction nodes, the circuit is not susceptible to the influence of noise.

Figures 4A, 4B:
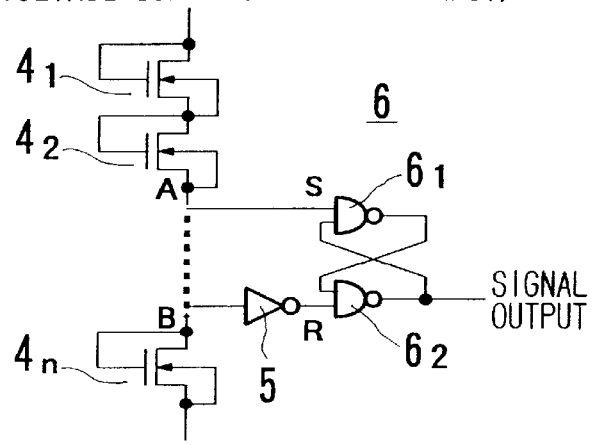
FIG. 4A is a circuit diagram showing a fourth embodiment of the substrate potential detecting circuit according to the present invention.
FIG. 4B is an illustration for assistance in explaining the operation of the fourth embodiment of the circuit shown in FIG. 4A.

FIGS. 4A and 4B show the fourth embodiment of the substrate potential detecting circuit according to the present invention, in which FIG. 4A shows the circuit construction and FIG. 4B is used to explain the operation thereof. In this fourth embodiment, the p-type MOS transistors $2_i$ (n=1, ..., n) shown in FIG. 3A are replaced with series connected n-type MOS transistors $4_i$ (i=1, ... n). In the transistor $4_i$ (i=1, ..., n), the source terminal is connected to the substrate terminal, and the drain terminal is connected to the gate terminal, respectively. Further, the operation of the fourth embodiment as listed in FIG. 4B is the same as with the case of the third embodiment as listed in FIG. 3B.

The fourth embodiment of the substrate potential detecting circuit as shown in FIG. 4A is provided with the same effect as with the case of the third embodiment shown in FIG. 3A.

Figures 5A, 5B:
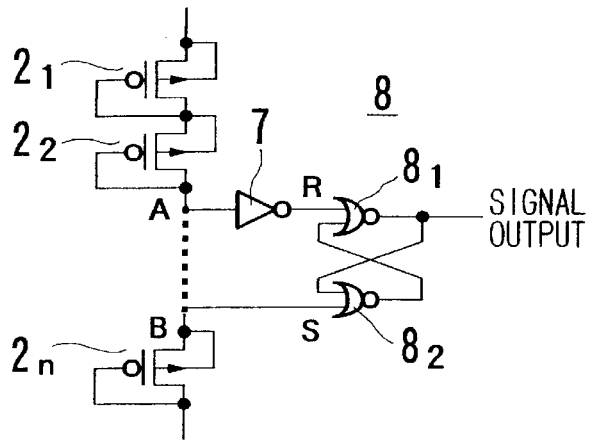
FIG. 5A is a circuit diagram showing a fifth embodiment of the substrate potential detecting circuit according to the present invention.
FIG. 5B is an illustration for assistance in explaining the operation of the fifth embodiment of the circuit shown in FIG. 5A.

FIGS. 5A and 5B show the fifth embodiment of the substrate potential detecting circuit according to the present invention, in which FIG. 5A shows the circuit construction and FIG. 5B is used to explain the operation thereof. This fifth embodiment is different from the third embodiment shown in FIG. 3A in that the RS flip-flop circuit 6 composed of the inversion gate 5 and the two cross-connected two-input NAND gates $6_1$ and $6_2$ is replaced with an RS flip-flop circuit 8 composed of an inversion gate 7 and two cross-connected two-input OR gates $8_1$ and $8_2$.

Further, a set terminal S of the RS flip-flop 8 is connected to a junction node B having a lower potential between the two junction nodes A and B of the series circuit composed of n-units of series connected p-type MOS transistors $2_1$, ..., $2_n$, and a reset terminal R thereof is connected to another junction node A having a higher potential between the two via an inversion gate 8 via the inversion gate 8.

In this embodiment, the supply voltage is applied to the source terminal of the transistor $2_1$, and the input signal is applied to the drain of the transistor $2_n$. Or else, the input signal is applied to the source of the transistor $2_1$, and the supply voltage is applied to the drain terminal of the transistor $2_n$. Further, the output signal of the substrate potential detecting circuit is derived from a Q output terminal of the RS flip-flop circuit 8.

Further, as shown in FIG. 5B, the operation of this fifth embodiment is the same as with the case of the third embodiment shown in FIG. 3B, so that the same effect can be obtained.

Figures 6A, 6B:
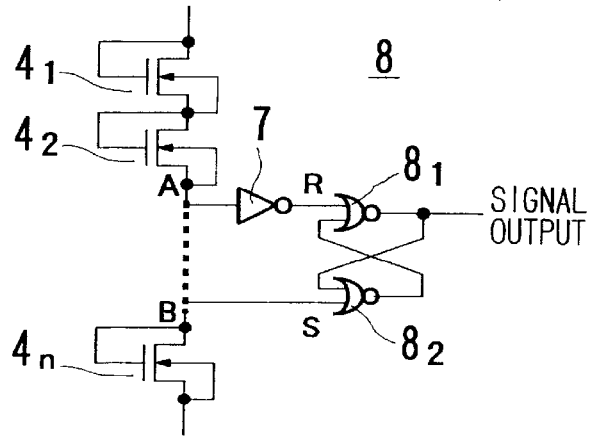
FIG. 6A is a circuit diagram showing a sixth embodiment of the substrate potential detecting circuit according to the present invention.
FIG. 6B is an illustration for assistance in explaining the operation of the sixth embodiment of the circuit shown in FIG. 6A.

FIGS. 6A and 6B show the sixth embodiment of the substrate potential detecting circuit according to the present invention, in which FIG. 6A shows the circuit construction and FIG. 6B is used to explain the operation thereof. In this sixth embodiment, the series connected p-type MOS transistors $2_i$ (n=1, ..., n) shown in FIG. 5A are replaced with series connected n-type MOS transistors $4_i$ (i=1, ..., n). In the transistor $4_i$ (i=1, ..., n), the source terminal is connected to the substrate terminal, and the drain terminal is connected to the gate terminal thereof, respectively. Further, as listed in FIG. 6B, the operation of the sixth embodiment is the same as with the case of the fifth embodiment as listed in FIG. 5B, so that the same effect can be obtained.

Figure 7:
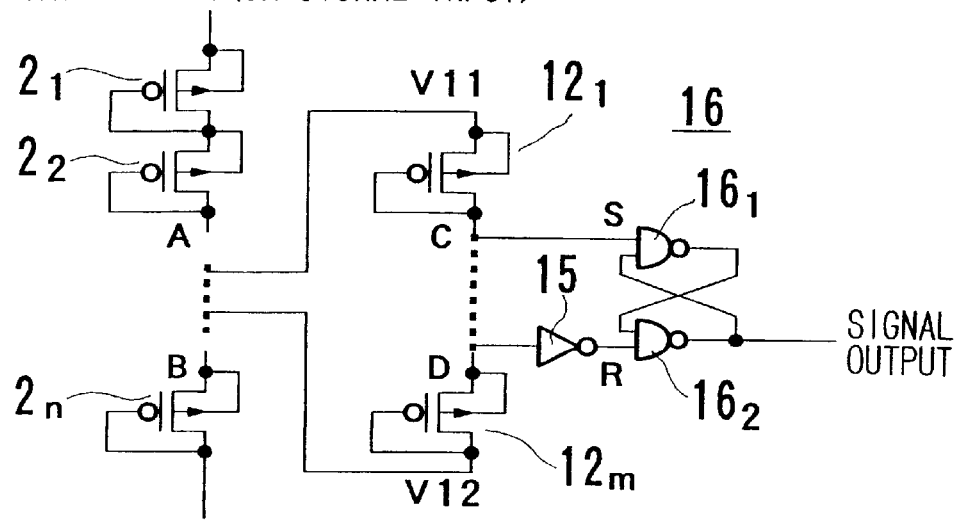
FIG. 7 is a circuit diagram showing a seventh embodiment of the substrate potential detecting circuit according to the present invention.

FIG. 7 shows the seventh embodiment of the substrate potential detecting circuit according to the present invention, which is composed of a first series connected circuit (referred to as the first MOS transistor train), a second series connected circuit (referred to as the second MOS transistor train), and an RS flip-flop circuit 16. The first MOS transistor train is composed of n-units (n≧2) of p-type MOS transistors $2_1$, ..., $2_n$. The second MOS transistor train is composed of m-units (m≧2) of p-type MOS transistors $12_1$, ..., $12_n$. The RS flip-flop circuit 16 is composed of an inversion gate 15 and two cross-connected two-input NAND gates $16_1$ and $16_2$.

In the first series connected circuit, in the same way as with the case of the first embodiment shown in FIG. 1, the source terminal of each transistor $2_i$ (i=1, 2, ..., n−1) is connected to the substrate terminal thereof, and the drain terminal thereof is connected to the gate terminal thereof. In other words, the drain terminal of a transistor $2_i$ (i=1, 2, ..., n−1) is connected the source terminal of another transistor $2_{i+1}$. Further, a supply voltage or an input signal is applied to the source terminal of the transistor $2_1$, and the input signal or the supply voltage is applied to the drain terminal of the transistor $2_n$.

Further, in the second series connected circuit, in the same way as above, the source terminal of each transistor $12_j$ (j=1, 2, ..., m) is connected to the substrate terminal thereof, and the drain terminal thereof is connected to the gate terminal thereof. In other words, the drain terminal of a transistor $12_j$ (j=1, 2, ..., m−1) is connected the source terminal of another transistor $12_{j+1}$. Further, the source terminal of the transistor $12_1$ is connected to a higher potential junction node A of the two intermediate junction nodes A and B of the first series connected circuit (the first transistor train), and the drain terminal of the transistor $12_m$ is connected to a lower potential junction node B of the two intermediate junction nodes A and B thereof.

On the other hand, the set terminal S of the flip-flop circuit 16 is connected to a higher potential junction node C of the two intermediate junction nodes C and D of the second series connected circuit (the second transistor train), and the reset terminal R of the flip-flop circuit 16 is connected to a lower potential junction node D of the two intermediate junction nodes C and D thereof via the inversion gate 15. Further, the output signal is derived from the Q output terminal of the flip-flop circuit 16.

Here, the channel widths of all the MOS transistors constituting the first MOS transistor train are equal to each other, and the channel widths of all the MOS transistors constituting the second MOS transistor train are also equal to each other. Further, the channel width of the transistor is so selected that the transistor is operative in the sub-threshold region of the transistor. When the channel width is selected as described above, a value obtained by dividing the voltage between both the end terminals of the first MOS transistor train by the number of the same MOS transistors becomes equal to or lower than the threshold voltage of the p-type MOS transistor. In the same way, a value obtained by dividing the voltage between both the end terminals of the second MOS transistor train by the number of the same MOS transistors becomes equal to or lower than the threshold voltage of the p-type MOS transistor.

Therefore, for instance, in the case where the first MOS transistor train is constructed by ten transistors (n=10) and further where the second MOS transistor train is constructed by ten transistors (m=10) between the fourth and fifth junction nodes counted from one end of the first MOS transistor train, if the output potential is derived from the third junction node counted from the same end of the second MOS transistor train, the derived output voltage is equal to a potential of 43/100 of the voltage between both ends of the first MOS transistor train. Here, if this output voltage is required to obtain by only the first MOS transistor train, 100-units of transistors are necessary (n=100). As describe above, in this seventh embodiment, since the two transistor trains are assembled with each other hierarchically, it is possible to realize a fine adjustment of the output potential by use of a lesser number of transistors, as compared with when the same fine adjustment is achieved by the single transistor train. Here, it is of course possible to increase the number of the hierarchical transistor trains more than three. The seventh embodiment of the substrate potential detecting circuit as shown in FIG. 7 is of course provided with the same effect as with the case of the third embodiment shown in FIG. 3A.

Further, in this seventh embodiment, although the two-input NAND gates are used as the flip-flop circuit, it is of course possible to use the two-input OR gates in the same way as with the case of the fifth embodiment shown in FIG. 5A.

Figure 8:
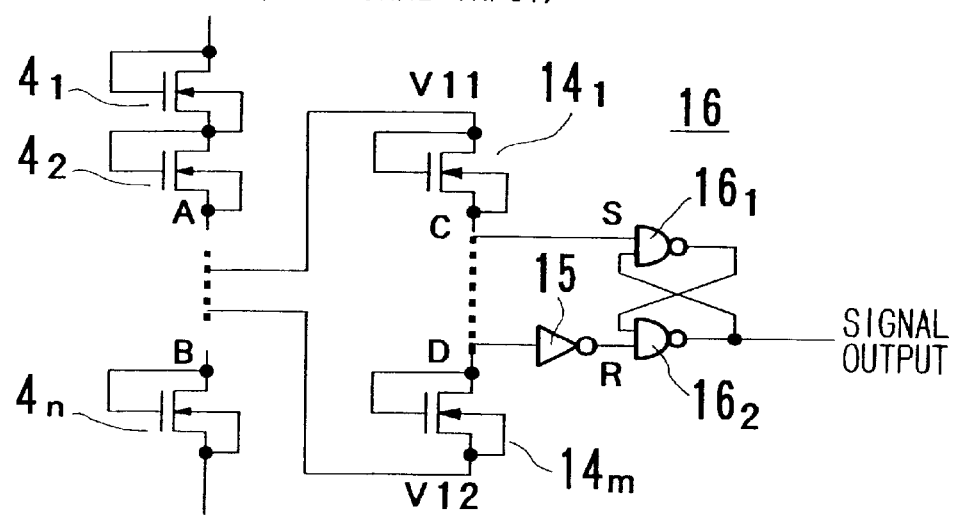
FIG. 8 is a circuit diagram showing an eighth embodiment of the substrate potential detecting circuit according to the present invention.
Figure 9:
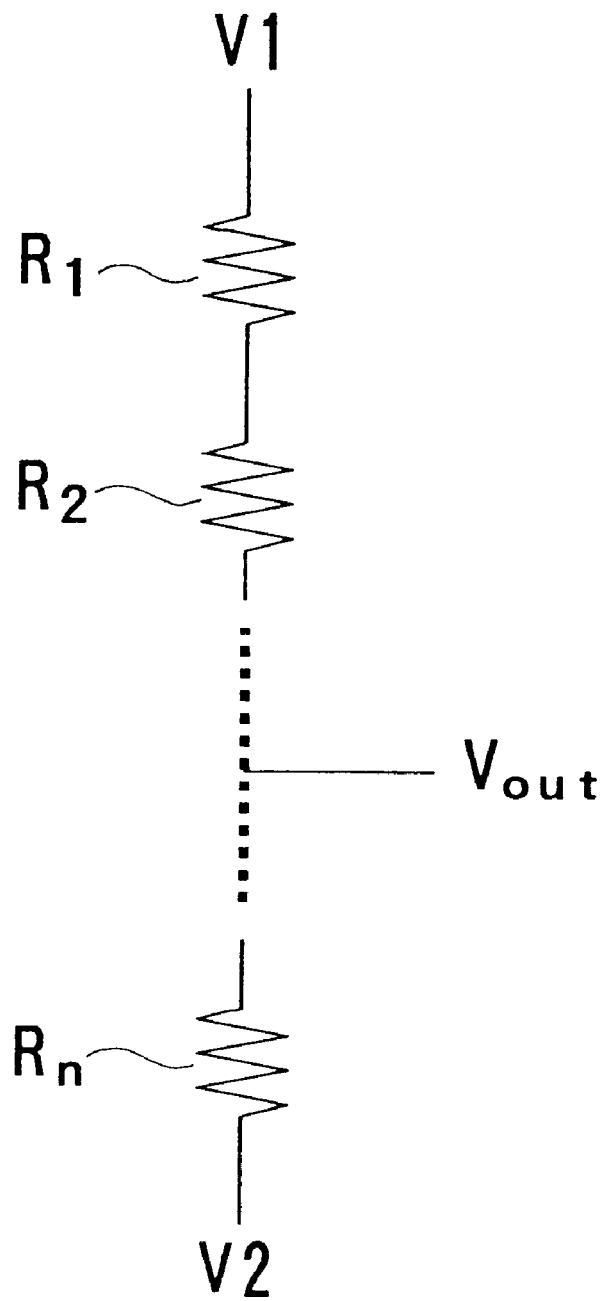
FIG. 9 is a circuit diagram showing a prior art substrate potential detecting circuit.

FIG. 8 shows the eighth embodiment of the substrate potential detecting circuit according to the present invention. In this embodiment, the p-type MOS transistors $2_i$ (n=1, . . . , n) for constituting the first transistor train shown in FIG. 7 are replaced with n-type MOS transistors $4_i$ (i=1, . . . , n). Further, the p-type MOS transistors $12_i$ (n=1, . . . , m) for constituting the second transistor train shown in FIG. 7 are replaced with n-type MOS transistors $14_j$ (j=1, . . . , m).

In the transistors $4_i$ (i=1, . . . , n) and the transistors $14_j$ (j=1, . . . , m) of the first and second transistor trains, the source terminal thereof is connected to the substrate terminal thereof, and the drain terminal thereof is connected to the gate terminals thereof, respectively.

Further, the channel widths of all the transistors $4_i$ for constituting the first transistor train are determined equal to each other, and the channel widths of all the transistors $14_j$ for constituting the second transistor train are determined equal to each other. Further, the channel width is so selected that the transistor is operative in the subs-threshold region. The operation of the eighth embodiment as shown in FIG. 8 is the same as with the case of the seventh embodiment shown in FIG. 7, so that the same effect can be obtained.

Further, in this eighth embodiment, although the two-input NAND gates are used as the flip-flop circuit, it is of course possible to use the two-input OR gates in the same way as with the case of the sixth embodiment.

Further, in the seventh and eighth embodiments shown in FIGS. 7 and 8, although the output is derived from the second transistor train via the flip-flop circuit, it is possible to derive the output from the first transistor train.

In the above-mentioned embodiments, when the supply voltage applied to one end of the series circuit is set to $V_{DD}$, and the input signal inputted to the other end thereof is set to a potential equal to or lower than that of the p-type or n-type well potential (usually equal to or lower than the ground potential), the substrate potential detecting circuit can operate so as to detect whether the potential of the p-type substrate or the p-type well is higher or lower than a potential or not.

In the same way, when the supply voltage applied to one end of the series circuit is set the ground potential, and the input signal is set to the potential of the n-type substrate or the n-type well (usually equal to or higher than $V_{DD}$), the substrate potential detecting circuit can operate so as to detect whether the potential of the n-type substrate or the n-type well is higher or lower than a potential or not.

As described above, in the substrate potential detecting circuit according to the present invention, the power consumption can be reduced, and further the circuit can be formed in a small pattern area.

What is claimed is:

1. A substrate potential detecting circuit, comprising:
   a series circuit composed of a plurality of same-conductivity type MOS transistors each having a source terminal connected to a substrate terminal thereof and a drain terminal connected to a gate terminal thereof, channel widths of all the MOS transistors being determined equal to each other and so selected that all the transistors are operative in a subthreshold region, respectively,
   an inversion gate; and
   an RS flip-flop circuit having:
   a set input terminal connected to one of two different junction nodes of a transistor train for constituting the series circuit, and
   a reset terminal connected to the other of the two different junction nodes via the inversion gate, wherein one end of the series circuit is connected to a supply voltage, and a substrate potential or a well potential is inputted to the other end of the series circuit, and an output is derived from a Q output terminal of the RS flip-flop circuit.

2. The substrate potential detecting circuit of claim 1, wherein the RS flip-flop circuit is composed of two cross-connected two-input NAND gates, and potential at one of the junction nodes is higher than that at the other of the junction nodes.

3. The substrate potential detecting circuit of claim 1, wherein the RS flip-flop circuit is composed of two cross-connected two-input NOR gates, and potential at one of the junction nodes is lower than that at the other of the junction nodes.

4. A substrate potential detecting circuit, comprising:

first to n-th (n≧2) series circuits each composed of a plurality of same-conductivity type MOS transistors; each of the transistors for constituting the i-th (i=2, ..., n) series circuit having a source terminal connected to a substrate terminal thereof and a drain terminal connected to a gate terminal thereof; the i-th (i=1, ..., n) series circuit being connected between two different junction nodes of a transistor train for constituting the (i−1)-th series circuit; and channel widths of all the MOS transistors for constituting the i-th (i=1, ..., n) series circuit being determined equal to each other and so selected that all the transistors for constituting the i-th series circuit are operative in a sub-threshold region, respectively, wherein one end of the first series circuit is connected to a supply voltage, and a substrate potential or a well potential is inputted to the other end of the first series circuit, and an output is derived from an intermediate junction node of a transistor train for constituting the n-th series circuit.

5. A substrate potential detecting circuit, comprising:

first to n-th (n≧2) series circuits each composed of a plurality of same-conductivity type MOS transistors; each of the transistors for constituting the i-th (i=2, ..., n) series circuit having a source terminal connected to a substrate terminal thereof and a drain terminal connected to a gate terminal thereof; the i-th (i=1, ..., n) series circuit being connected between two different junction nodes of a transistor train for constituting the (i−1)-th series circuit; and channel widths of all the MOS transistors for constituting the i-th (i=1, ..., n) series circuit being determined equal to each other and so selected that all the transistors for constituting the i-th series circuit are operative in a sub-threshold region, respectively, an inversion gate; and an RS flip-flop circuit having:
  a set input terminal connected to one of two different junction nodes of a transistor train for constituting the n-th series circuit, and a reset terminal connected to the other of the two different junction nodes via the inversion gate, wherein one end of the first series circuit is connected to a supply voltage, and a substrate potential or a well potential is inputted to the other end of the first series circuit, and an output is derived from a Q output terminal of the RS flip-flop circuit.

6. The substrate potential detecting circuit of claim 5, wherein the RS flip-flop circuit is composed of two cross-connected two-input NAND gates, and potential at one of the junction nodes is higher than that at the other of the junction nodes.

7. The substrate potential detecting circuit of claim 5, wherein the RS flip-flop circuit is composed of two cross-connected two-input NOR gates, and potential at one of the junction nodes is lower than that at the other of the junction nodes.

8. The substrate potential detecting circuit of claim 5, wherein the RS flip-flop circuit is composed of two cross-connected two-input NAND gates, and potential at one of the junction nodes is higher than that at the other of the junction nodes.

9. The substrate potential detecting circuit of claim 5, wherein the RS flip-flop circuit is composed of two-cross-connected two-input NOR gates, and potential at one of the junction nodes is lower than that at the other of the junction nodes.

* * * * *